United States Patent [19]

Timberlake et al.

[11] Patent Number: 5,372,686

[45] Date of Patent: Dec. 13, 1994

[54] DIRECT CURRENT SPUTTERING OF BORON FROM BORON/CORON MIXTURES

[75] Inventors: John R. Timberlake, Allentown, N.J.; Dennis Manos, Williamsburg, Va.; Ed Nartowitz, Edison, N.J.

[73] Assignee: The United States of America as represented by the United States Department of Energy, Washington, D.C.

[21] Appl. No.: 67,967

[22] Filed: May 27, 1993

[51] Int. Cl.$^5$ .............................................. C23C 14/34
[52] U.S. Cl. .......................... 204/192.15; 204/192.16; 204/298.08; 204/298.09
[58] Field of Search ...................... 204/192.15, 192.16, 204/298.08, 298.09

[56] References Cited

U.S. PATENT DOCUMENTS

| | | | |
|---|---|---|---|
| 4,594,294 | 6/1986 | Eichen et al. | 428/552 |
| 4,629,547 | 12/1986 | Honda et al. | 204/192.15 |
| 4,683,043 | 7/1987 | Melton et al. | 204/192.15 |
| 5,013,604 | 5/1991 | Allen et al. | 428/402 |
| 5,203,977 | 4/1993 | Makowiecki et al. | 204/192.15 |

OTHER PUBLICATIONS

"New Techniques for Sputtering Pure Boron and Boron-Carbon Compositions", Abstract-Poster Paper for Thirty-Third Annual Meeting, Division of Plasma Physics, Nov. 4, 1991.

*Primary Examiner*—Aaron Weisstuch
*Attorney, Agent, or Firm*—Mark P. Dvorscak; Robert J. Fisher; William R. Moser

[57] ABSTRACT

A method for coating a substrate with boron by sputtering includes lowering the electrical resistance of a boron-containing rod to allow electrical conduction in the rod; placing the boron-containing rod inside a vacuum chamber containing substrate material to be coated; applying an electrical potential between the boron target material and the vacuum chamber; countering a current avalanche that commences when the conduction heating rate exceeds the cooling rate, and until a steady equilibrium heating current is reached; and, coating the substrate material with boron by sputtering from the boron-containing rod.

4 Claims, 1 Drawing Sheet

DIRECT CURRENT SPUTTERING OF BORON FROM BORON/CORON MIXTURES

CONTRACTUAL ORIGIN OF THE INVENTION

The United States Government has rights in this invention pursuant to Contract No, DE-AC02-76CH03073 between the U.S. Department of Energy and Princeton University,

BACKGROUND OF THE INVENTION

Boron coating, or "boronization" of tokamaks, with either chemical vapor deposition of boron from boron containing compounds, or "boronization" from evaporation of solid targets of boron/carbon mixtures, has produced beneficial results. Boron has properties that are advantageous to improved reactor performance. As a material that comes in contact with the plasma edge, it has been found to reduce the influx of some materials, the retention of hydrogen (tritium), the oxygen and oxygenated species, and even lower the loop voltage. The presence of boron also helps maintain the low atomic number preferred for a tokamak coating. Additionally, the use of boron coatings may have widespread applicability in vacuum systems for electrical and/or corrosion resistance in contained environments with controlled atmospheres under non-vacuum conditions.

Diborane, a highly toxic pyrophoric gas, is presently used for boronization of certain substrates or chambers, such as the TFTR at Princeton Plasma Physics Laboratory. However, it leaves residual hydrogen, as do other hydrogenous boron compounds unless they are completely reacted. Diborane is also used in chemical vapor deposition systems in the semiconductor industry. For use in tokamaks, safety dictates that the handling of this gas is not permitted as often as desired, and thus diborane is not suitable for boronization processes as frequently as needed.

Pure boron has a resistivity of $\approx 10^6$ ohm-cm at room temperature and is therefore not a good candidate for conventional D.C. sputtering. Because boron is a nonconductor at room temperatures, it has not been sputtered except by costly radio-frequency plasma sources. RF sources that operate at 13.6 MHz are commercially available. These sources are about one order of magnitude more expensive than conventional direct current sources, and have critical proximity limitations with the sputter target. Although boron is nonconductive at room temperature, it has a unique property of becoming more conductive at higher temperatures: its resistivity changes to $\approx 10$ ohm-cm at 400° C. This property of boron can be exploited to provide a conductive material that can be sputtered with direct current.

Accordingly, it is an object of the present invention to provide an alternative process for the boronization of substrates, such as the walls of tokamak chambers, which avoids the safety problems exhibited by conventional boronization methods involving diborane or other hydrogenous boron compounds.

It is another object of the present invention to provide a less costly alternative to conventional methods of boronizing certain substrates.

Another object of the present invention is to provide a sputtering process for the coating of substrates with boron that takes advantage of the unique conduction characteristics of this element.

SUMMARY OF THE INVENTION

A method for coating a substrate with boron by direct current sputtering provides for lowering the electrical resistance of a boron-containing rod to allow electrical conduction in the rod, and then placing the boron-containing rod inside a vacuum chamber that contains additional substrate material to be coated. The chamber is evacuated to about 50–500 mTorr helium or argon, and itself can be the substrate of the sputtering. Next, an electrical potential between the target material and the vacuum vessel is applied, while countering a current avalanche that commences when the heating rate by conduction exceeds the cooling rate, until a steady equilibrium is reached. Once equilibrium is reached, the method provides for coating the substrate material with boron by sputtering from the boron-containing rod.

The resistance of the boron containing rod may be lowered by heating the rod to a temperature sufficient to lower its resistivity to allow electrical conduction with a transformer connected to an alternating current.

The electrical potential between the target material and the vacuum vessel is created by supplying (variable) direct current power between the transformer, heated target, and the vacuum vessel.

The current avalanche that commences when the heating rate exceeds the cooling rate is countered by applying a non-linear resistance to the current.

In another aspect of the invention, a substrate can be coated with boron and carbon from a boron composition by direct current sputtering. This is accomplished by preparing a target electrode by coating a carbon target with boron chips using a pyrolyzation technique; placing the prepared target electrode into a vacuum chamber containing substrate material to be coated; applying an electrical potential between the substrate material and the boron coated carbon target; and, coating the substrate material with boron and carbon by sputtering from the boron containing carbon target. The vacuum chamber can be evacuated to about 100 mTorr helium or argon. Additionally, boron carbide or boron nitride are substituted for the boron chips.

BRIEF DESCRIPTION OF THE DRAWINGS

The above-mentioned and other features of the invention will become more apparent and be best understood, together with the description, by reference to the accompanying drawings, in which.

DETAILED DESCRIPTION OF THE INVENTION

Figure 1:
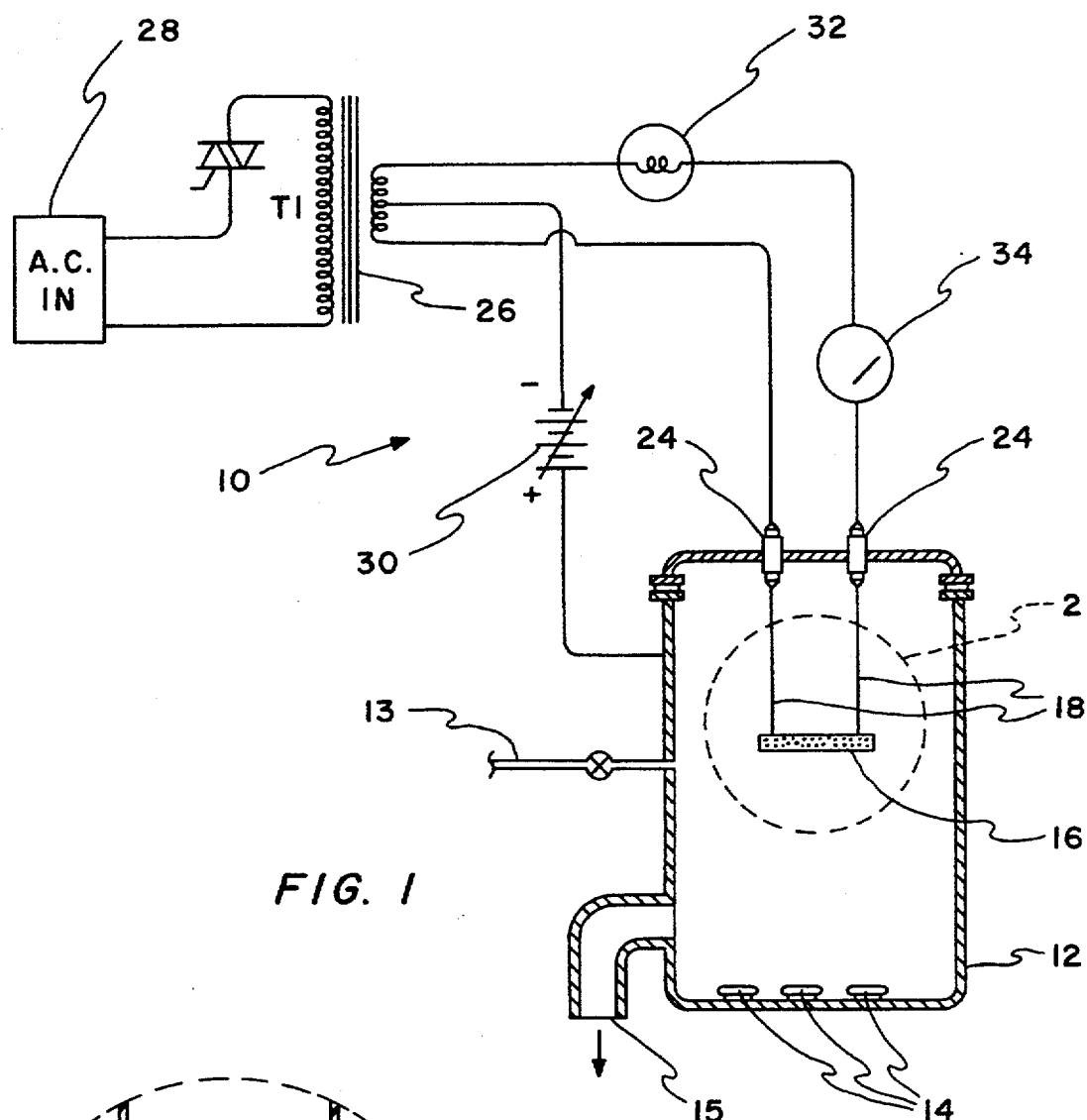
FIG. 1 shows an electrical diagram for a method for sputtering boron in accordance with the present invention; and, FIG. 2 shows a detailed view of a boron-conducting rod used in the diagram of FIG. 1.
Figure 2:
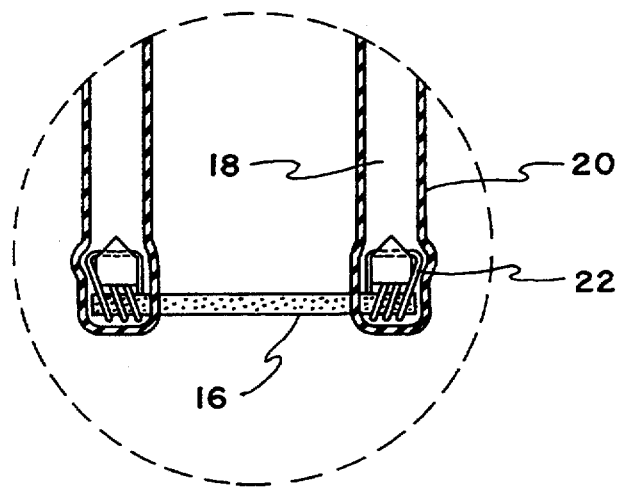

Referring to the drawing figure, a circuit 10 for a process for coating a substrate with boron is shown. A vacuum vessel 12 contains a plurality of substrates 14 that are to be coated with boron. Also within the vessel 12 is a boron-containing rod 16 by which the substrates and vacuum vessel will be coated. A gas inlet 13 and a pump port 15 are also shown on the vessel 12. The rod 16 may be a high purity polycrystalline boron rod and is held in the chamber by conducting wires 18 which complete an electrical circuit. By reference to FIG. 2, the preferred arrangement of the boron containing rod 16 within the circuit is shown. The conducting wires 18 may be copper having a boron nitride coating 20. The rod 16 is preferably secured by platinum wires 22. Electrical feedthrough insulators 24 provide shielding from the vacuum vessel 12. The conducting wires 18 are connected to the secondary of a transformer 26. The transformer 26 is provided to step down the incoming voltage from an alternating current source 28.

A direct current power supply 30 is connected to the center tap of the transformer 26 and the vacuum vessel 12. The d.c. power supply 30 is a variable power supply having a range of about 0 to 1500 volts. A means 32 for equalizing current avalanching of the heated boron rod and a 0-1 a.c. amp antmeter 34 complete the circuit.

As explained earlier, boron is non-conductive at room temperatures, but it has a unique property of becoming more conductive at higher temperatures. The present invention takes advantage of this property to provide a conductive material that can be sputtered with direct current. The process begins by lowering the electrical resistance of the boron-containing rod 16 to allow electrical conduction in the rod. Specifically, the resistance of the boron rod is lowered by heating the rod 16 to a temperature sufficient to lower its resistivity. At a temperature of about 400° C., the resistivity of boron becomes about 10 ohm-cm. At this resistance, electrical conduction can occur. The rod 16 can be heated outside the vacuum vessel 12 or it can be heated inside the vessel by electrical conduction, or radiant or contact heating. Once the heating rate exceeds the cooling rate, the current starts to avalanche since conduction generates heat, which lowers the resistance, which in turn increases the current. The equalizing means 32 is used to counter this current avalanche. Preferably, a tungsten wire (lamp) is used since this material becomes more resistive as a function of increasing temperature. An electrical potential is applied between the substrate material 14, the vacuum vessel 12 and the boron target (rod) 16 by placing the direct current power supply 30 between the transformer 26 and the vessel 12. The vessel 12 is evacuated to a pressure of about 50 to 500 mTorr helium or argon.

When a steady equilibrium current is reached, the substrates 14 in the vessel 12, placed in proximity to the previously non-conductive boron containing rod 16, may be sputter coated. It is important to note that with the disclosed invention, it is possible that the chamber itself can be the substrate of the boron deposition.

Sputtering from boron compositions is also possible. A pyrolyzation technique can be used to attach carbon plus boron chips onto a solid piece of carbon. With argon or helium at about 100 mTorr, this boron-containing carbon rod is then used as a sputtering target using the conventional direct current techniques, i.e. by applying an electrical potential between the substrate material and the boron coated carbon target, and then coating the substrate material with boron and carbon by sputtering from the boron containing carbon target. After exposure to atmospheric conditions, Auger analysis revealed boron concentrations as high as 30% on coated substrates. Various boron carbide compositions are possible for direct current sputtering. The substitution of boron carbide chips instead of boron chips present another alternative. Similarly, boron nitride or other refractory materials containing boron and/or carbon could be sputter coated. Co-sputtering of the non-boron materials may also occur.

There has thus been shown a novel method for direct current sputtering of boron. The disclosed invention takes advantage of boron's unique electrical conductivity properties at elevated temperatures. Direct current boron sputtering provides enhanced safety while allowing the use of conventional sputtering techniques. The use of existing, low-cost power supplies is also a benefit realized through this method. The invention is an improvement over the use of diborane, tile gas currently being used for boronization of tokamaks since the invention leaves no residual hydrogen, is non-toxic, and presents no particular fire hazard.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described to best explain the principles of the invention and its practical application and thereby enable others skilled in the art to best explain the principles of the invention and its practical application and thereby enable others skilled in the art to best utilize the invention in various embodiments and with various modifications as are suited to the particular use contemplated. It is intended that the scope of the invention be defined by the claims appended hereto.

The embodiments of the invention in which exclusive property rights or privileges are claimed are defined as follows:

1. A method for coating a vacuum chamber with boron by direct current sputtering, comprising:
   a) securing a boron-containing rod inside the vacuum chamber to be coated by connecting electrically conducting wires extending from the outer taps of a transformer secondary to the ends of the rod;
   b) lowering the electrical resistance of the boron-containing rod by heating it to thereby allow electrical conduction in the rod;
   c) applying a DC electrical potential between the vacuum chamber and the boron-containing rod with a variable direct current power source connected to the vacuum chamber and the center tap of the transformer secondary;
   d) countering a current avalanche that commences when the heating rate from said electrical conduction in the boron-containing rod exceeds the cooling rate, by application of an equalizing means placed between the boron containing rod and the transformer such that a steady equilibrium current is reached; and,
   e) coating the vacuum chamber with boron by direct current sputtering from the now conductive boron containing rod.

2. The method of claim 1, including the step of evacuating the vacuum chamber to about 50–500 mTorr helium or argon.

3. The method of claim 1 wherein the boron-containing rod is secured in the vacuum chamber by platinum wire.

4. The method of claim 3 wherein electrical feedthrough insulators placed in the vacuum chamber and through which the electrically conducting wires pass provide shielding from the vacuum chamber.

* * * * *

UNITED STATES PATENT AND TRADEMARK OFFICE
CERTIFICATE OF CORRECTION

PATENT NO. : 5,372,686

DATED : December 13, 1994

INVENTOR(S) : John R. Timberlake, Dennis Manos and Ed Nartowitz

It is certified that error appears in the above-identified patent and that said Letters Patent is hereby corrected as shown below:

On the title page, change the title [54] from "Direct" Current Sputtering of Boron from Boron/Coron Mixtures"

to

--Direct Current Sputtering of Boron from Boron/Carbon Mixtures--.

Signed and Sealed this

Sixteenth Day of May, 1995

*Attest:*

BRUCE LEHMAN

*Attesting Officer*   Commissioner of Patents and Trademarks